United States Patent [19]

Paülus et al.

[11] 4,334,219
[45] Jun. 8, 1982

[54] OPERATION SETTING DEVICE HAVING STATIONARY TOUCH-SENSITIVE CONTROL ELEMENTS

[75] Inventors: Rüdolf Paülus; Klaus Mischo, both of Munich, Fed. Rep. of Germany

[73] Assignee: AGFA-Gevaert AG, Leverkusen, Fed. Rep. of Germany

[21] Appl. No.: 122,689

[22] Filed: Feb. 19, 1980

[30] Foreign Application Priority Data

Feb. 28, 1979 [DE] Fed. Rep. of Germany ....... 2907811

[51] Int. Cl.³ .............................................. G09G 3/00
[52] U.S. Cl. ................................ 340/712; 340/365 C; 340/365 UL
[58] Field of Search ............ 340/712, 365 C, 365 UL, 340/365 R, 711, 706

[56] References Cited

U.S. PATENT DOCUMENTS

| | | | |
|---|---|---|---|
| 3,187,321 | 6/1965 | Kameny | 340/365 UL |
| 3,956,745 | 5/1976 | Ellis | 340/365 UL |
| 4,055,735 | 10/1977 | Eachus et al. | 340/365 C |
| 4,055,755 | 10/1977 | Nakamura et al. | 340/365 C |
| 4,078,257 | 3/1978 | Bagley | 340/365 UL |
| 4,088,837 | 5/1978 | Singer | 340/365 UL |
| 4,202,038 | 5/1980 | Peterson | 340/365 UL |
| 4,242,676 | 12/1980 | Piguet et al. | 340/365 C |

*Primary Examiner*—Marshall M. Curtis
*Attorney, Agent, or Firm*—Michael J. Striker

[57] ABSTRACT

The operation setting device includes a keyboard having stationary control keys arranged on a transparent support plate of insulating material, each key of the keyboard being formed of a pair of transparent electrically conductive material secured to the outer face of the support plate and being connectable to a switching device sensitive to a change of resistance between the contacts in each pair. A visual identification card is located behind the support plate and having its indentification signs in register with respective keys.

10 Claims, 12 Drawing Figures

4,334,219

OPERATION SETTING DEVICE HAVING STATIONARY TOUCH-SENSITIVE CONTROL ELEMENTS

BACKGROUND OF THE INVENTION

The present invention relates in general to a device for setting the operation of a functional unit, and in particular to a device of the type having stationary touch-sensitive control elements in which upon bridging isolated contact surfaces by a lower resistance, means are actuated which release the switching action.

The touch-sensitive stationary contact elements of this type fulfill the important requirements for a negligible contact pressure, functional reliability as well as low construction costs. The disadvantage of prior art setting units of this type however is the fact that the identification or description of individual functions which are controlled by the contact elements and mostly indicated by switching on an indication lamp is limited to the range between the two contact surfaces or to an indication range outside the control element proper. An arbitrary configuration of the designation sign in the area of the stationary contact elements in prior art setting or control units of this type is impossible. Moreover in indicating or displaying the function of the prior art touch-sensitive control elements, the circumferential field of the element has to be indicated and consequently the configuration of the indication sign is further restricted.

SUMMARY OF THE INVENTION

It is therefore a general object of the present invention to overcome the aforementioned disadvantages.

More particularly, it is an object of this invention to provide an improved control or operation setting device of the aforementioned type which provides a substantially increased freedom for the configuration and design of the indication signs for the function of respective control elements.

An additional object of this invention is to provide such an improved control device which is economic in production and relatively simple in its structure.

In keeping with these objects, and others which will become apparent hereafter, one feature of the invention resides in an operation setting device having stationary pressure sensitive control elements, in the provision of a transparent support plate of insulating material which defines two opposite faces, the control elements being constituted by pairs of stationary contacts made of an electrically conductive transparent material which is secured to one of the faces of the support plate, means for releasing a switching function when the contacts in respective pairs are bridged by a lower electrical resistance, and a visual identification plate adjoining the other face of the support plate to identify the function of the control element. By virtue of the provision of the transparent support plate and the pairs of transparent contact surfaces it is made possible that the identification plate can be observed through the touch-sensitive contacts and consequently when designing the identification plate the contact elements need not be taken into account.

The identification plate is divided into regions assigned to the different functions of the contact elements. With advantage the arrangement is made such that when viewing in the direction of the user of the device, the separate plate with the contact elements and the identification plate are arranged one after the other so that the transparent contact elements are directly in alignment with the symbol or sign of the corresponding function of each contact element and if desired also in alignment with the actuating signal for respective functions.

According to a further advantageous feature of this invention the identification plate in the device is exchangeable. In this manner the same operation setting device can be employed for controlling different operations. In addition, the adjustment of the identification plate such as, for example, a written signal plate to particular circumstances can be made without problems. It is thus made possible for example to adjust the description of the functions of an arbitrary apparatus to different foreign languages inasmuch while the transparent operation setting unit remains without any change, and only the description of functions which is arranged behind the transparent setting plate is exchanged.

Preferably the stationary keys or control elements supported on the insulating support plate are made in the form of a key matrix which is assembled of a plurality of parallel connected discrete contact surfaces to form a large surface contact in each pair of contacts. In this manner an increased operational comfort is attained because the user is no longer limited to a single minute contact area but can instead touch any point in a larger area in order to release the switching operation.

It is particularly advantageous when according to still another feature of this invention at least a part of the contact surfaces is freely interconnectable in order to achieve variable groups of touch contacts. The electric evaluation of the changed resistance conditions between the contact surfaces in respective pairs takes place outside the supporting plate. The latter plate therefore supports only a suitable pattern of contact webs or strips which are alternately connected in parallel according to the required range of each contact element whereas the unused contact strips remain unconnected. In this manner the transparent support plates with the pattern of contact strips can be mass-produced in the form of a standard touch panel whereupon the adjustment of the standard panel to specific conditions and sizes of the apparatus in which the device of this invention is to be employed can be carried out in the most simple manner.

Furthermore, even if the size of the surface of the support plate is fixed, it is possible to add new functions or to remove functions which are no longer necessary simply by increasing or reducing the partial contact strips for each control element while simultaneously changing the interconnection of the contacts and the description of their function.

By means of this operation setting device of this invention there is for the first time provided a standard module which can be produced in mass series at substantially reduced costs and which can be adjusted for all stages of development and production of a particular apparatus in which the device of this invention is to be used and can be readily and flexibly adjusted to changed functional conditions of the apparatus. Due to the broad applicability of the device of this invention, it can be employed in connection with a broad spectrum of different apparatuses.

Because of the increasing technological complexity of apparatuses and due to the increasing number of function setting possibilities in such apparatus, the facility of the indication of the set function becomes more and more difficult inasmuch for certain operational condition of the apparatus parts of the control elements are unnecessary whereas in another operational condition again a different part of the setting keys is needed. For example, when operating a radio recorder the primary setting process after switching on the apparatus is the selection of a particular transmitting station and the subsequent operational processes are the setting of the loudness or the sound coloration or the balance and the like; for the subsequent recording of the transmitted program only the functions relating to the tape recorder are of interest such as the forward movement of the recording tape, rewinding function, the sound volume level, start and stop functions and the like. It is true that in conventional input control systems the apparatus has a plurality of input control possibilities which, however, in most cases cannot be employed simultaneously and therefore when operating one group of functions controls pertaining to the remaining groups are unnecessary, lead to errors and disturb. The large number of control keys necessitates a correspondingly large control panel on the apparatus. The oversized control panel frequently necessitates an increase in the overall dimensions of the apparatus which is not justified by the volume of component parts in the apparatus housing. For this reason in many apparatuses, for example in the pocket calculators keys are designated by two or even by three functions so that an oversized housing can be avoided.

According to this invention a control or setting unit for input and output data which enables in a most advantageous manner the display of numeric, alphanumeric or graphic symbols and which is provided with a keyboard having transparent stationary contact keys or so-called touch panel which is arranged in the direction of view of the user in front of the display surface. The transparent touch keys can with advantage be directly applied on the display surface in order to attain a particularly simple structure of the control unit. The display devices are formed with advantage of a LCD matrix.

In this manner, a reciprocal operation of the apparatus is made possible in a particularly readily visible and simple manner whereby the instruction input range and the display range are arranged on a common surface area resulting in an extremely compact structure of the input and output unit.

By means of the proposed input and output unit of this invention it is now made possible that the display can selectively indicate the difference input functions or can be changed to indicate the output. It provides therefor a multifunction indication which enables alternatively to define the functions of the entry keys on the one hand as well as the announcement of the result on the other hand.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

DESCRIPTION OF THE PREFERRED EMBODIMENTS

Figure 1:
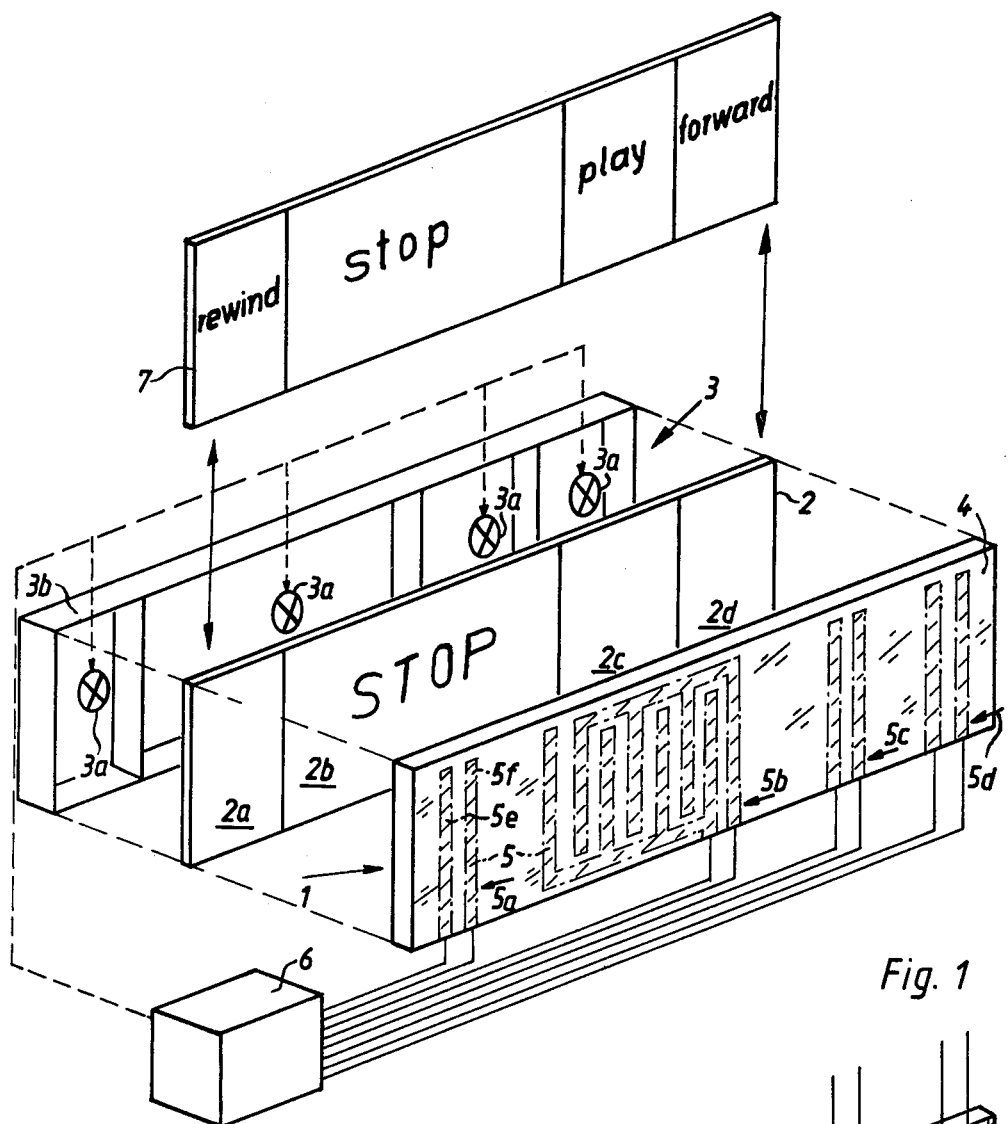
FIG. 1 is a schematic perspective view of a function entry unit of this invention including a transparent touch panel, exchangeable key description panel and a key illumination device.

FIG. 1 shows in an exploded view individual elements of a function entry unit according to this invention. The unit includes a transparent touch panel 1, a key description card 2 and a key illumination device 3. The three component parts are held in position in a non-illustrated frame.

The touch panel is constituted by an optically transparent and electrically insulating support plate 4 made for example of glass and supporting on its outer surface contact strips 5 made of an optically transparent electrically conductive and wiping proof material such as for example indium oxide ($In_2O_3$). By touching two adjacent contact strips, for example, strips 5e and 5f, the latter strips are bridged by a lower resistance than that of the insulating plate 4, and resistance decrease is converted into a switching function by means of an electronic switching device 6 forming a part of the apparatus for which the control unit of this invention is employed. The connections between the switching unit 6 and the contact strips 5 are illustrated only schematically and can be made by means of conventional connectors such as resilient trongues, closed circuit elastomer or other connecting means.

The contact surfaces are arranged on the outer side of the transparent support plate 4 facing the user. Opposite the inner side of the plate 4 and in alignment in the direction of view of the user, there is arranged a keyboard description card 2 subdivided into individual descriptive fields 2a through 2d which are in register with corresponding pairs of contact strips 5a through 5d. The key description card 2 is normally opaque so that its sign carrying front face can be selectively lighted by indication lights 3a of an illumination device 3 which is arranged behind the rear side of the card 2. A screening frame 3b insures that only the desired description field or section 2a through 2d is fully illuminated whereas the remaining fields remain opaque. The selective activation of the lamps 3a takes place via the switching device 6 simultaneously with the corresponding actuation of touch contacts 5a through 5d.

The function entry unit illustrated in FIG. 1 is designed as an entry control unit for a tape recorder. The four keys 5a through 5d are assigned to function such as forward, rewind, stop and play. Descriptions corresponding to these functions are provided in fields 2a through 2d of the key description card 2. In the event that the same apparatus is to be exported to a country with a different language, the existing key description card 2 is simply removed from the setting unit and exchanged for another key description card 7 having inscriptions in the desired other language. In spite of spatial register of respective control elements or keys with their functional description, it is achieved that due to the transparency of the key contacts and due to exchangeability of the key descriptive card an additional adjustment of the description of the key board to different requirements is possible without problems.

The key 5b in FIG. 1 corresponding to the stop sign is formed of a pair of separate contacts which are respectively formed of a plurality of parallel connected contact strips. The large surface contacts of this type considerable facilitates the operation and are made possible also in panels having a limited useful surface inasmuch as due to the transparency of the contacts the description of the contact keys is no longer made outside the key but directly behind the key so that the descriptive sign no longer requires a separate space.

Alternatively if desired the indication card can be firmly connected to the touch panel 4, for example by glueing the description card to the rear side of the panel 4 or by printing the sights on the rear side.

Figure 2:
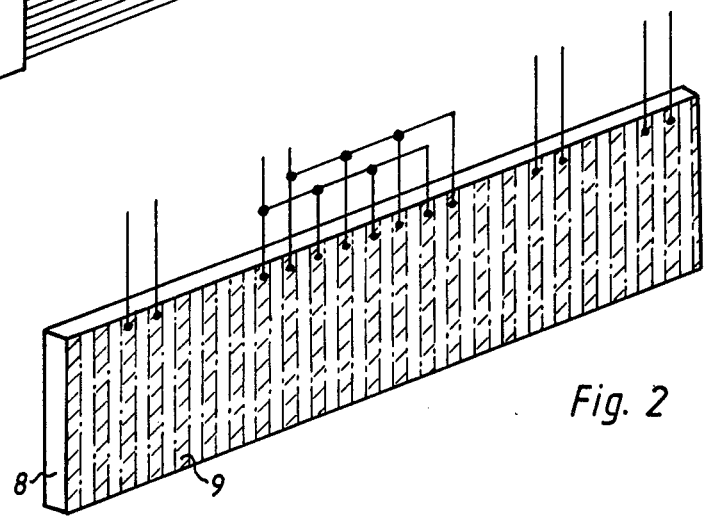
FIG. 2 is a perspective view of a modification of the touch panel of FIG. 1 having a uniform pattern of contact surfaces adapted for various interconnections.

In manufacturing the transparent touch panels 4 it is of advantage when a transparent support 8 is provided with a regular pattern of conductive transparent contact strips 9 whereby the electric interconnection is carried out outside the touch panel itself. The panel of this type is illustrated in FIG. 2 whereby the respective conductive strips 9 are interconnected so as to create touch keys corresponding to those in the panel of FIG. 1.

Figure 3:
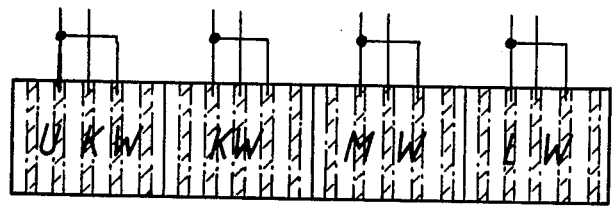
FIGS. 3 to 5 illustrate front views of the touch panel of FIG. 2 with different interconnections of contact surfaces defining respective touch keys.
Figure 4:
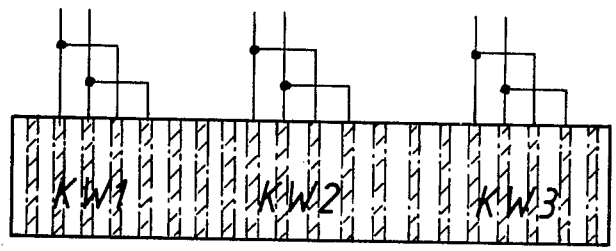
Figure 5:
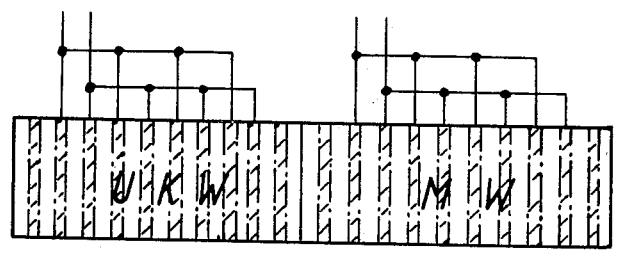
Figure 6:
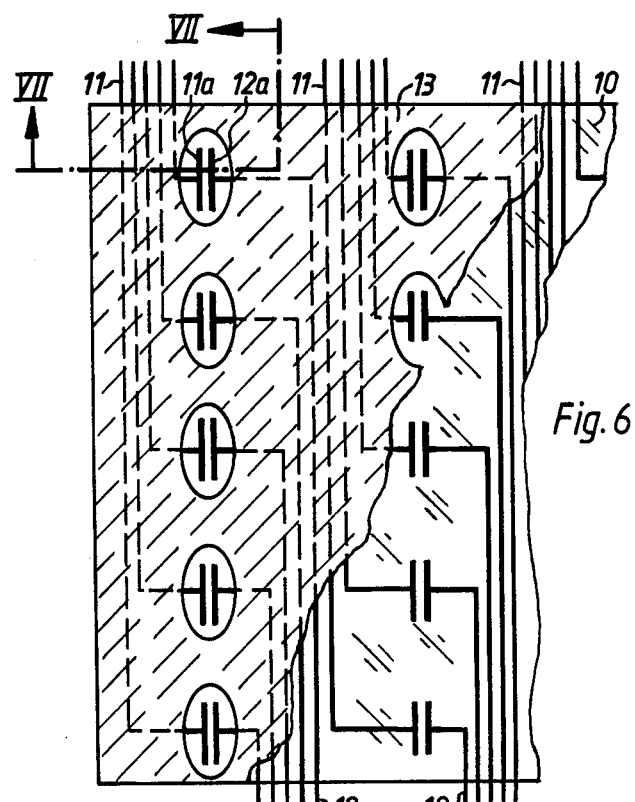
FIG. 6 is a cut-away portion of the touch panel shown on an enlarged scale and being provided with a key matrix.
Figure 7:
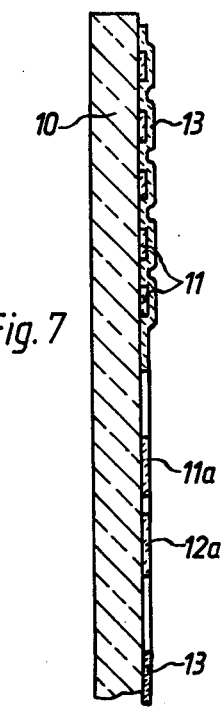
FIG. 7 is a side section of the touch panel of FIG. 6 taken along the line VII—VII.

FIGS. 3 to 5 illustrate different keyboards formed simply by different interconnection of uniform contact strips 9 on the same touch panel whereby to each group of keyboards is assigned a different key description card. In this manner it is possible to attain different size of respective control keys corresponding to the nature of the different applications. By using the same standard touch panel having a uniform pattern of contact surfaces or strips it is made possible that the keyboard can be adjusted for the inclusion of additional functions or for the removal of functions which are no longer needed simply be reducing or increasing the number of sections pertaining to a specific function while simultaneously changing the connection of the conductive strips outside the touch panel and also changing the description of respective keys.

Instead of using a uniform pattern of transparent conductive strips or webs as illustrated in FIGS. 1 through 5, in many applications it is more advantageous to use a matrix like arrangement of the touch contacts as illustrated in FIGS. 6 to 9. Similarly as in the preceding example, it is again employed a transparent, electrically insulating support plate 10 made for example of glass, upon which conductive tracks 11 and 12 of a transparent, electrically conductive material such as indium oxide are deposited for example by vaporization. Subsequently the entire panel surface that means also the surface including the conductive tracks 11 and 12 is covered with a continuous, transparent, electrically insulating layer 13 of quartz for example deposited by vaporization. This layer 13 is interrupted only in the range of key contacts 11a and 12a in order to enable the bridging of these contacts by the finger tips.

Figure 8:
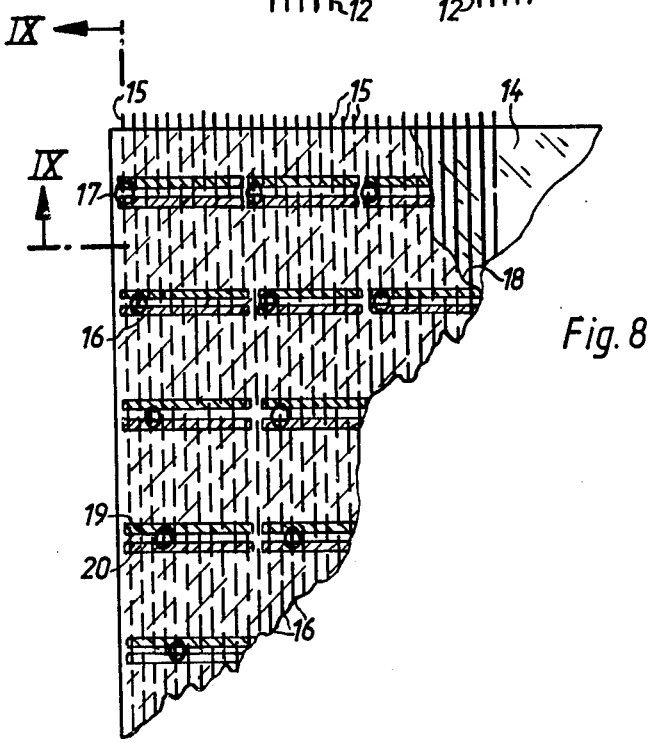
FIG. 8 is another embodiment of a touch panel provided with a touch key matrix.
Figure 9:
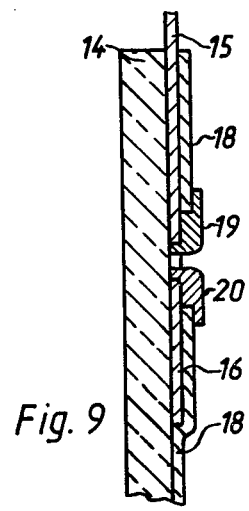
FIG. 9 is a sectional side view of the panel of FIG. 8 taken along the line IX—IX.

Another embodiment of the touch contact matrix is illustrated in FIGS. 8 and 9. In this example a transparent support or substrate 14 is provided with parallel pairs of contact tracks 15 and 16 which are interrupted at areas 17 which are distributed over the entire panel surface to form a matrix-like pattern as indicated by circles. The whole upper surface of the panel is covered with a transparent insulating layer 18 which is open in the area of the circles 17. Pairs of additional transparent, electrically conductive strips 19 and 20 are deposited on the transparent insulating layer 18 in the direction transverse to the underlying contact strips 15 and 16 and intersect the latter in the region of their interruptions in the circular areas 17. The contact strips 19 and 20 in the area of the circle 17 are connected to one of the two contact strips 15 and 16 and serve therefore in the area of each circle 17 as the actual key 19 and 20.

Figure 10:
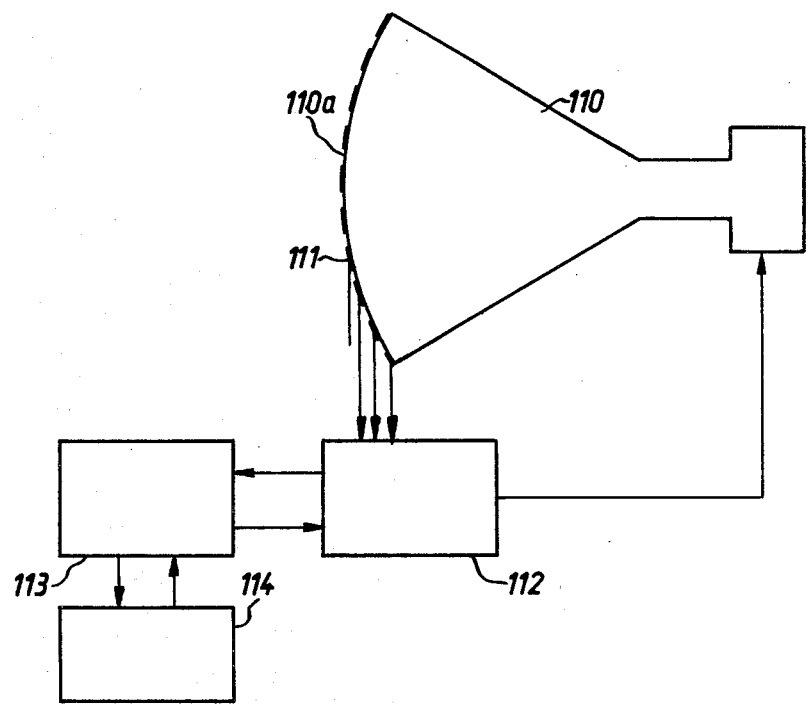
FIG. 10 is a schematic diagram of a circuit for cathode ray tube acting as a display panel in the device of this invention.

Referring now to FIG. 10 there is designated by the reference numeral 110 a cathode ray tube having a display surface 110a facing the user and a transparent touch contact matrix 111 deposited on the surface 110a.

Instructions entered by the user via the key matrix are fed to a program storing unit 112 and processed in subsequent stages 113 and 114. The final result is optically displayed on the screen of the cathode ray tube. The program storing unit 112 cooperates for example with a processing stage 113 which handles the data entered by the user on the key matrix according to a given program and according to data from an apparatus 113 to display the results on the screen of the CRT 110.

Figure 11:
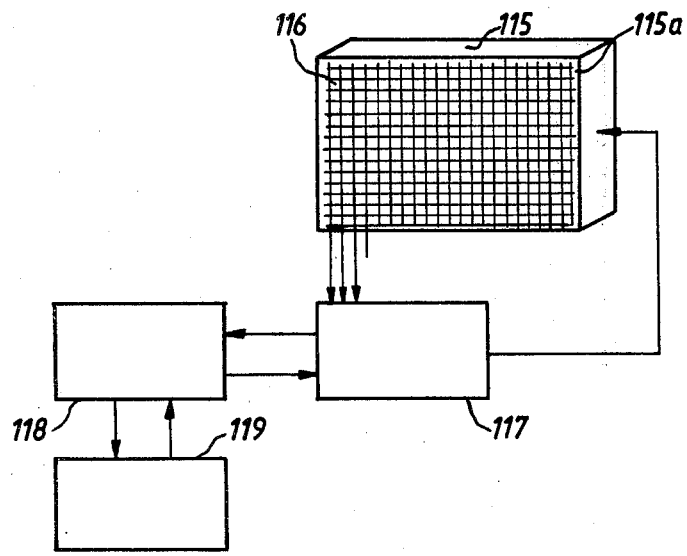
FIG. 11 is a schematic diagram of a circuit for the entry and display of data employing an LCD element as a display panel.

The display unit in the embodiment of this invention as shown in FIG. 11 is LCD element 115 the display surface 115a thereof is again provided with a transparent touch contact matrix 116. Circuit 117 is again a programmable register and by reference numeral 118 is designated a control device cooperating with an apparatus 119 in similar manner as in the preceding example.

Figure 12:
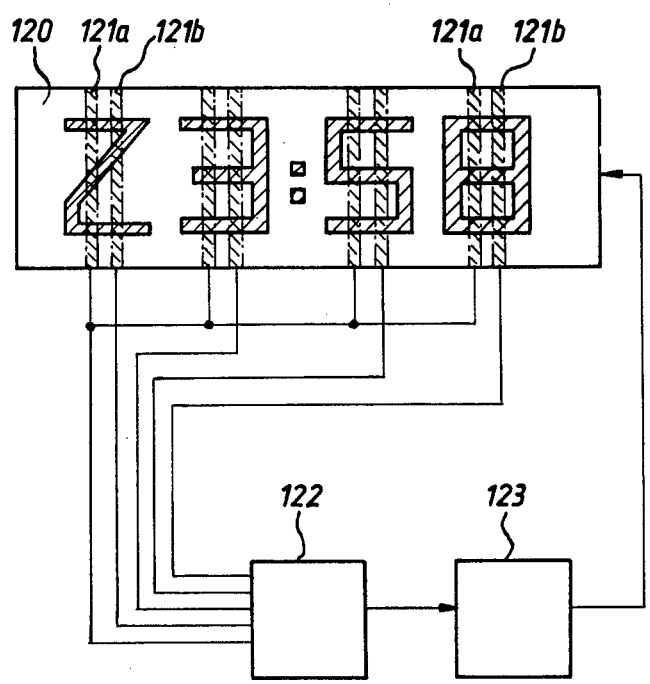
FIG. 12 is a schematic circuit diagram of a table clock having an operation setting unit of this invention with touch keys arranged over the display characters.

FIG. 12 shows schematically a digital electronic table clock. Standard table clocks of this type include generally two digital pairs indicative of hours and minutes separated by a colon sign periodically blinking in intervals of seconds. The setting of time is accomplished in conventional manner via keys for setting hours and minutes and via additional keys for fast and slow advance of the digits. In the embodiment of the clock as illustrated in FIG. 12 the time setting is substantially simpler and faster than that carried out by conventional setting devices. The display surface of the dial unit 120 is provided with the aforedescribed transparent pairs of contact strips 121a and 121b corresponding to respective digits of the dial indication. According to the duration of the touch with the contact keys a pulse generator 122 generates a succession of pulses which advance the display digits in the assigned dial field pertaining to the activated key contacts.

It will be understood that each of the elements described above or two or more together, may also find a useful application in other types of constructions differing from the types described above.

While the invention has been illustrated and described as embodied in specific examples of a setting unit, it is not intended to be limited to the details shown, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. An operation setting device having stationary control keys, comprising transparent support means of insulating material defining two opposite faces, said keys including pairs of stationary contact strips made of an electrically conductive material secured to one of said faces; means for interconnecting said contact strips outside said support means to provide for variable groups of key elements; means for releasing a switching function when said contacts in respective pairs are bridged by a lower electric resistance; and an exchangeable visual identification plate arranged opposite the other face of said transparent support means to identify the function of respective control keys.

2. A data entry and display unit comprising a display panel for visually indicated numeric, alphanumeric or graphic signs; a stationary keyboard arranged in front of said display panel, the keys of said keyboard being formed of a pair of transparent electrically conductive touch contacts connectable to a switching unit and responsive to the change of resistance between the contacts to release a switching function, said keyes being in register with assigned signs on said display panel and a key illumination device for selectively illuminating said signs in response to the actuation of said keys.

3. The unit as defined in claim 2 wherein said display panel is of transparent material, said signs being deposited at one side of said panel and said keyboard being deposited on the opposite side of said panel.

4. The device defined in claim 1, wherein said identification plate is divided in sections corresponding to areas occupied by respective control keys.

5. The device as defined in claim 4, wherein said support means is a support plate and said sections of said identification plate are in register with the assigned keys on said support plate.

6. The device as defined in claim 1, wherein at least one key element includes contacts formed by a parallel connection of a plurality of said contact surfaces to form a large area contact key.

7. The device as defined in claim 1, further including an illumination device in register with the rear wall of said visual identification plate to selectively illuminate a sign on said identification plate corresponding to the actuated contact key.

8. The device as defined in claim 1, wherein said visual identification plate is a display screen of an electronic device.

9. The device as defined in claim 8, wherein said electrically conductive transparent contacts are deposited on the outer surface of said electrically controlled display screen.

10. The device as defined in claim 8, wherein said display screen is a LCD matrix.

* * * * *